US008115671B2

(12) United States Patent
Jaklitsch

(10) Patent No.: US 8,115,671 B2
(45) Date of Patent: Feb. 14, 2012

(54) PRECISION METHOD FOR ALIGNING RADIO FREQUENCY PULSE TIMING CHARACTERISTICS

(75) Inventor: James J. Jaklitsch, Parkton, MD (US)

(73) Assignee: AAI Corporation, Hunt Valley, MD (US)

( * ) Notice: Subject to any disclaimer, the term of this patent is extended or adjusted under 35 U.S.C. 154(b) by 1474 days.

(21) Appl. No.: 11/606,886

(22) Filed: Dec. 1, 2006

(65) Prior Publication Data

US 2012/0014486 A1 Jan. 19, 2012

(51) Int. Cl.
G01S 13/08 (2006.01)
(52) U.S. Cl. ............................ 342/118; 342/174; 342/16
(58) Field of Classification Search ........... 342/147–158
See application file for complete search history.

(56) References Cited

U.S. PATENT DOCUMENTS

| 6,531,979 B1* | 3/2003 | Hynes .............................. 342/90 |
| 7,453,961 B1* | 11/2008 | Li et al. ......................... 375/343 |
| 2001/0049295 A1* | 12/2001 | Matsuoka et al. ............. 455/562 |
| 2005/0156780 A1* | 7/2005 | Bonthron et al. .............. 342/107 |
| 2005/0258999 A1* | 11/2005 | Jenkins et al. ................. 342/194 |
| 2006/0215739 A1 | 9/2006 | Williamson et al. |
| 2007/0058700 A1 | 3/2007 | Fenton |

FOREIGN PATENT DOCUMENTS

| WO | WO-01/41390 A | 6/2001 |
| WO | WO 2005098469 A1 * | 10/2005 |

* cited by examiner

Primary Examiner — Timothy A Brainard
(74) Attorney, Agent, or Firm — Venable LLP; Jeffri A. Kaminski

(57) ABSTRACT

A system and method for correlating first pulsed signals with second pulsed signals includes a first receiving unit, a second receiving unit and a correlation device. The first receiving unit is disposed to receive from a first device one or more first pulsed signals. The first device may include a plurality of pulsed radio frequency source under test signal sources. The second receiving unit is disposed to receive from a second device one or more second pulsed signals. The second device may include a local oscillator pulsed signal source. The correlation device can correlate the first pulsed signals with the second pulsed signals to align a timing characteristic of the first pulsed signals to the equivalent timing characteristic of the second pulsed signals.

31 Claims, 9 Drawing Sheets

PRECISION METHOD FOR ALIGNING RADIO FREQUENCY PULSE TIMING CHARACTERISTICS

BACKGROUND OF THE INVENTION

1. Field of the Invention

The present embodiments relate to aligning radio frequency pulse timing characteristics.

2. Related Art

There are many applications where precision alignment of radio frequency pulse timing characteristics are required. As merely one example, when a multiplicity of pulsed RF signal sources are used together in advanced electronic warfare (EW) signal generation systems, parasitic error terms in the signal generation circuits may produce timing skews between channels. It is therefore necessary to align the channel to channel timing, so that when pulses are commanded to occur at the same time, they are exactly coincident, for example, to sub-nanosecond accuracy.

An exemplary radio frequency (RF) pulse has characteristics illustrated in FIG. 1. As shown, the pulse consists of a sinusoidal carrier frequency that is gated on and off to form the pulse. Because the on/off gating is not instantaneous, both the leading and trailing edges of the pulse have exponential rise/fall times, though the slew rates are typically different. As indicated in the illustration of FIG. 1, the rise time is typically much slower than the fall time. The characteristic results from the physics of the devices used to switch the pulsed carrier on and off.

The exact time of occurrence of an radio frequency (RF) or microwave pulse is very difficult to measure to sub-nanosecond accuracy. The reason for this is illustrated in FIG. 1, which shows a 1 gigahertz (GHz) RF pulse, with 24 nanosecond (ns) pulse width and a rise time of approximately 7 ns. The leading edge of the pulse is generally defined as the time at which the pulse envelope, illustrated in FIG. 2, passes the fifty percent (50%) point. However, as can be seen from FIG. 1, the pulse envelope is sampled by the carrier frequency, which is an oscillating signal, and the instant the envelope passes through the 50% point almost certainly occurs between carrier cycles.

Schottky detector diodes can be used to detect the envelope of the RF pulse, and the detected video output from the diode is compared to the 50% voltage threshold to determine the pulse time of arrival. This legacy approach works well if the allowable error in timing measurements is greater than 5 to 7 ns. However, for higher accuracy measurements (for example, less than 1 ns), and particularly for measurements across a wide band of frequencies, detector diodes are insufficient.

Detector diodes have time constants of approximately 3 ns, and are frequency dependent. Furthermore, the match from diode to diode is not particularly predictable, with the result that the matching of detected waveforms on two channels of an oscilloscope does not guarantee that the pulse times are necessarily coincident to sub-nanosecond accuracy. Video ringing on the detected pulses is yet another distortion mechanism that limits the accuracy at which pulse timing can be measured.

RF pulses below a few GHz can be directly viewed on high speed sampling oscilloscopes, and the point at which the envelope crosses the 50% threshold can be determined by interpolating the captured data. This approach is only good for relatively low frequencies, however, as the best digital scopes available today typically cannot directly sample frequencies above about 5 GHz. Furthermore, the effects of limited sample rates tend to limit the accuracy that may be obtained from interpolation.

An alignment receiver may be used to achieve RF pulse timing, where the receiver receives signal sources under test RF pulses and aligns the pulses in phase and in amplitude. However, such systems have the limitation that they have little or no real capability to measure pulse timing characteristics. Thus, while an alignment receiver may provide a means to accurately measure and align phase and amplitude of an RF carrier signal, the measurements of pulse timing must be made by other instrumentation.

SUMMARY OF THE INVENTION

Exemplary embodiments of the disclosed embodiments provide a system and method for correlating first pulsed signals with second pulsed signals. In one embodiment, the system includes a first receiving unit, a second receiving unit and a correlation device. The first receiving unit can be disposed to receive from a first device one or more first pulsed signals. The first device may include a plurality of pulsed radio frequency source under test signal sources. The second receiving unit may be disposed to receive from a second device one or more second pulsed signals. The second device may include a local oscillator pulsed signal source. The correlation device can correlate the first pulsed signals with second pulsed signals to align a timing characteristic of the first pulsed signals to the equivalent timing characteristic of the second pulsed signals.

In an exemplary embodiment, an alignment receiver is provided. The alignment receiver may include the aforementioned correlation device. In addition, the alignment receiver may include the a third device including a wideband filter and an analog-to-digital filter. The combination of the foregoing filters can be disposed to generate a representation of a first pulsed signal. The representation can include respective in-phase (I) and quadrature-phase (Q) components of the first pulsed signal.

In yet another embodiment, a method is provided which includes combining a first pulsed signal with a second pulsed signal, correlating the first pulsed signal with the second pulsed signal to generate a correlation function, and determining a delay between the first pulsed signal and the second pulsed signal using the correlation function. In one such embodiment, the first pulsed signal may be a radio frequency (RF) pulsed signal generated by a source under test (SUT) device, and the second pulsed signal may be a signal generated by a local oscillator (LO). In an exemplary embodiment, the delay is determined from an amplitude reference for a leading edge of the correlation function, and an amplitude reference for a trailing edge of the correlation function. In a related embodiment, these amplitude references are determined from the respective maximum amplitudes and shape factors of the respective leading and trailing edges of the correlation function.

Further objectives and advantages, as well as the structure and function of preferred embodiments, will become apparent from a consideration of the description, drawings and examples.

BRIEF DESCRIPTION OF THE DRAWINGS

The foregoing and other features and advantages of the disclosed embodiments will be apparent from the following, more particular description, as illustrated in the accompanying drawings wherein like reference numbers generally indicate identical, functionally similar, and/or structurally similar elements.

DETAILED DESCRIPTION OF THE INVENTION

Embodiments of the invention are discussed in detail below. In describing the embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention. All references cited herein are incorporated by reference as if each had been individually incorporated.

Figure 1:
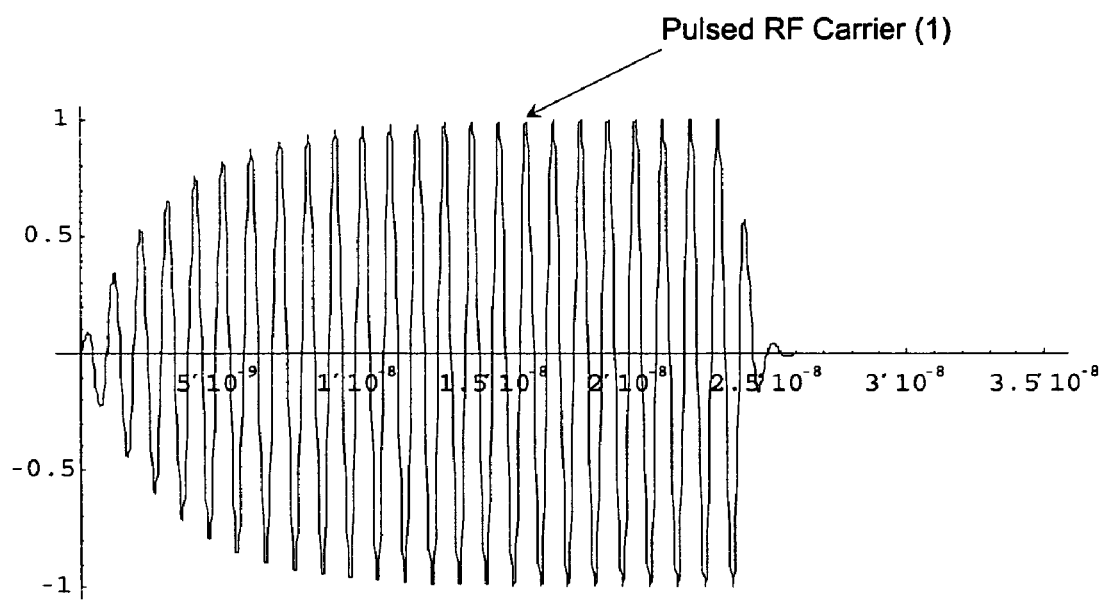
FIG. 1 depicts an exemplary embodiment of a radio frequency pulse characteristic.
Figure 2:
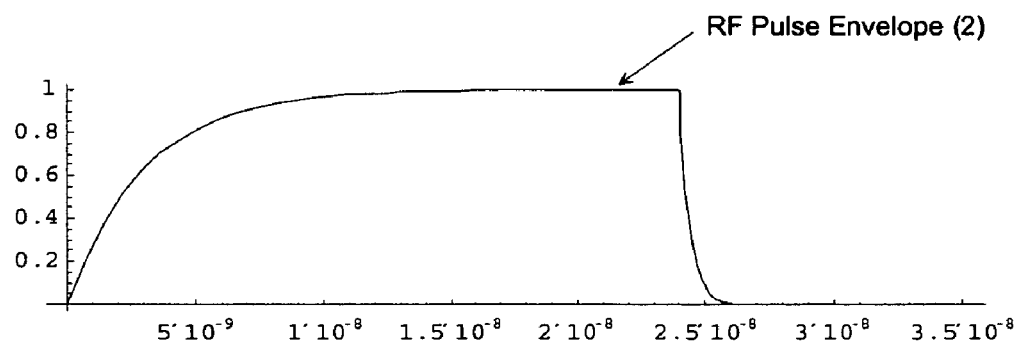
FIG. 2 depicts an exemplary embodiment of a radio frequency pulse envelope.
Figure 3:
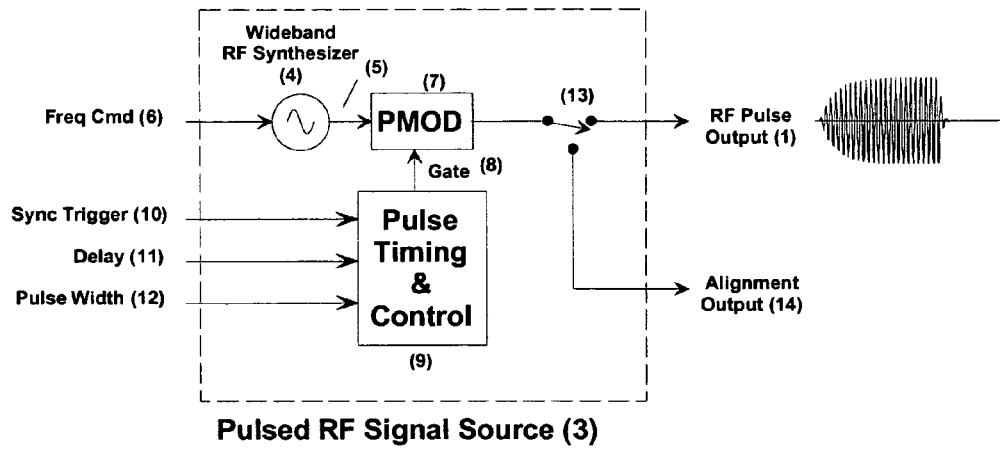
FIG. 3 depicts an exemplary embodiment of a pulsed radio frequency signal source.

Beginning with FIG. 3, the figure depicts an exemplary conceptual illustration of a pulsed RF signal source 3. In this exemplary implementation, a wideband RF synthesizer 4 generates a continuous wave (CW) RF signal 5, at a frequency specified by an external frequency command 6. The CW RF signal 5 can then be gated by a pulse modulator 7, which turns on momentarily to output an RF pulse 1 at the designated frequency. The pulse timing can be controlled by a gate signal 8, which is generated by pulse timing and control logic 9.

As illustrated in the embodiment of FIG. 3, the pulse timing and control logic 9 can be referenced to the master time-base by means of a synchronization (sync) trigger 10. The sync trigger 10 can be, for example, a periodic strobe that serves as the timing reference for pulse generation. The position, in time and the width of the RF pulse 1, can be controlled by the delay 11 and pulse width (PW) 12 commands, respectively. In embodiments of advanced systems, the resolution of these signals can be better than 100 picoseconds (0.1 ns), with the result that pulse timing can be controlled to a very fine degree.

In the illustrated embodiment, an RF switch 13 may be employed to divert the RF pulse output 1 to an alignment output port 14, thereby routing the output of the pulsed RF signal source 3 back to an alignment receiver 15, so that its phase and amplitude can be measured. For phase and amplitude measurements, the pulse modulator 7 can be set to a constant ON state, so that the output is a continuous wave (CW) RF Signal.

Figure 4:
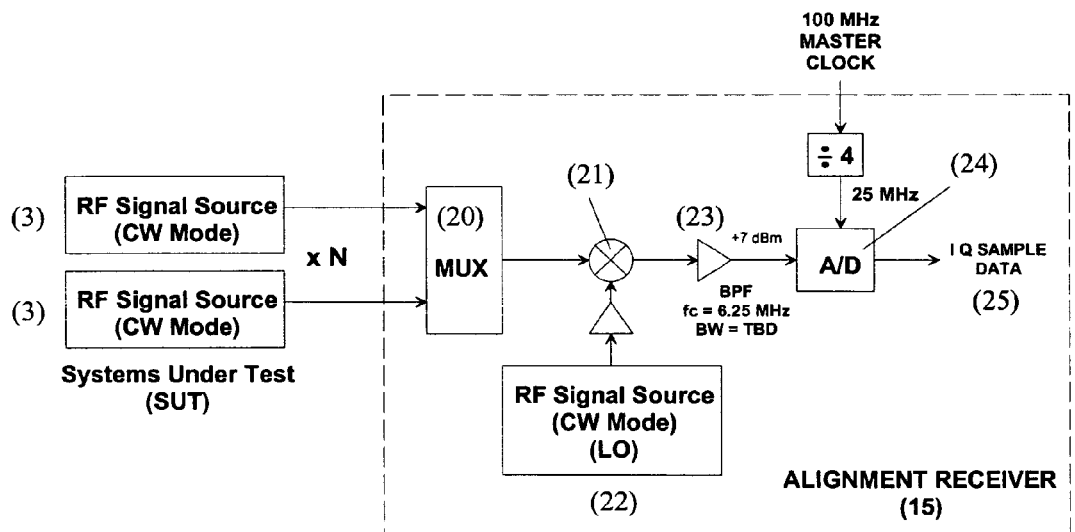
FIG. 4 depicts an exemplary embodiment of an alignment receiver.

FIG. 4 illustrates an exemplary embodiment of the alignment receiver 15, as described in reference to the embodiment of FIG. 3. In an embodiment, a multiplicity of RF signal sources 3 can be aligned, in phase and amplitude, by configuring the RF signal sources under test (SUT) 3 to each produce a respective CW output, and routing them, one at a time, by means of a multiplexer 20, into the components of alignment receiver 15. The CW RF signal sent out of the multiplexer can be down-converted by mixing it 21 with a wideband, tunable CW synthesized local oscillator (LO) 22. In an embodiment, the LO can be frequency tuned to always be offset from the SUT frequency (meaning, the frequency of the RF signal SUT) by a known intermediate frequency (IF), which in the illustrated exemplary embodiment equals 6.25 MHz.

Accordingly, in this embodiment the output of the mixer 21 is a CW IF at 6.25 MHz. The signal can then be filtered through a band pass filter 23 and digitized in an analog-to-digital (A/D) converter 24. In an embodiment, the A/D converter 24 samples at exactly four times the 6.25 MHz IF (in the present example, 25 MHz), and the sampled data is processed, in accordance with well known principles, to respectively extract an in-phase (I) and a quadrature-phase (Q) representation of the measured signal, yielding an I, Q sampled data signal 25. The I, Q sampled data signal 25 can be processed, again in accordance with well known principles, to compute the amplitude and phase of the RF signal SUT 3.

The foregoing has a limitation with respect to measurement of pulse timing characteristics. Thus, while the alignment receiver 15 provides a means to accurately measure and align phase and amplitude of the RF carrier, the measurements of pulse timing would likely have to be made by other instrumentation.

Figure 5:
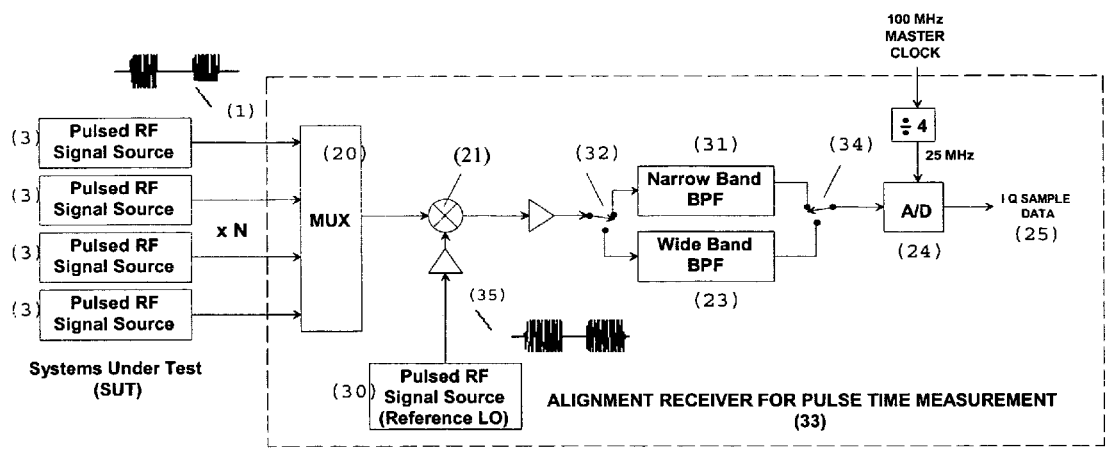
FIG. 5 depicts an exemplary embodiment of an alignment receiver for pulse time measurement.

FIG. 5 illustrates an exemplary embodiment of a precision system and related method for aligning RF pulse timing characteristics. In particular, the embodiment of FIG. 5 illustrates an exemplary alignment receiver for pulse time measurement 33 disposed to receive a plurality of RF SUT signals from RF SUTs 3. As understood by skilled persons, this embodiment has some similarities with the technique used to precisely measure magnitude and phase of the RF systems under test (SUT), as described with reference to FIGS. 3 and 4. As an example, for magnitude and phase measurements, both the RF SUT signals 1 and the LO signal 35 can be CW signals, resulting in a CW IF signal that is digitally analyzed to extract magnitude and phase.

For timing measurements, however, in one embodiment both the RF SUT 3 and the LO 30 respectively transmit pulsed signals, respectively signals 1 and 30, and the bandpass filter 31 is a very narrowband device. In an exemplary such embodiment, these elements each have specific characteristics that permit the alignment receiver 33 to function as a correlation processor. The ability to correlate the RF SUT and LO pulse trains 1, 35 enables precise timing relationships to be determined by analyzing the measured correlation function, thereby extracting the time coordinates corresponding to the RF SUT pulse leading and trailing edges.

As illustrated in the embodiment of FIG. 5, the pulse timing characteristics of the RF SUT 3 can be measured by routing their pulsed RF output 1, one at a time for example, by means of a multiplexer 20 into the alignment receiver 33. The alignment receiver 33 can down-convert the pulsed output of the multiplexer 20 by mixing it with a pulsed tunable local oscillator (LO) 30 using mixer 21.

The output of the mixing process can be a pulsed waveform 34, at a fixed (in the exemplary embodiment, 6.25 MHz) IF, with a duty cycle proportional to the degree of correlation between the time of occurrence of the SUT RF output pulse 1 and the time of occurrence of the LO pulse 35. As used herein, the term "duty cycle" refers to the ratio of the output high time to the total cycle time, and is expressed as a percentage, with 50% representing equal clock high and low times.

For timing measurements, both the SUT RF output pulses 1 and the LO pulses 35 can be repetitive pulse trains, with a predetermined frequency separation (of for example 6.25 MHz in the present embodiment), and a repetition rate that is, for example, a multiple of such frequency separation (for example, 25 MHz, or exactly 4 times the aforementioned 6.25 MHz IF frequency, in the present embodiment).

In an embodiment, the two waveforms 1, 35 are complementary. For example, the RF SUT pulse 1 may run at a 40% duty cycle, while the LO pulse 35 may run at a 60% duty cycle. In the exemplary embodiment of a pulse having a 40 ns cycle time, the RF SUT pulse 1 would be active for 16 ns, or 40% of the duration, whereas the LO pulse 35 would be active for 24 ns, or 60% of the duration. In one or more embodiments, the two pulses must not have the same duration. In an embodiment described herein, the reference waveform 35 is preselected to have a longer duration than reference waveform 1, though the reverse may be employed by skilled persons practicing alternative embodiments.

Figure 6A:
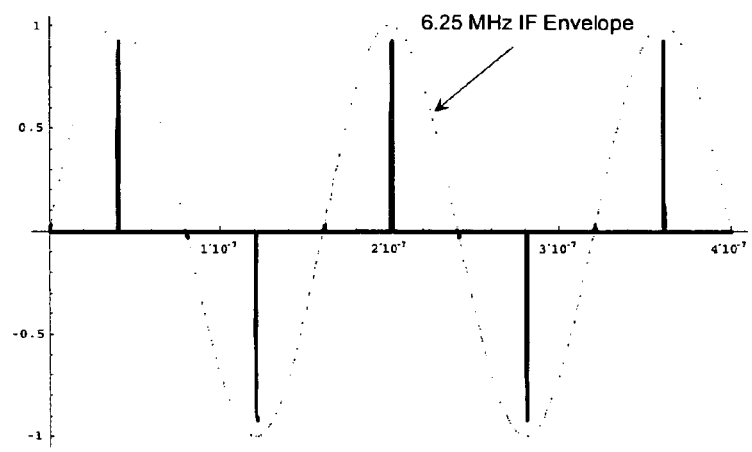
FIG. 6A depicts an exemplary embodiment of the respective input and output intermediate frequency waveform signals of a narrow-band bandpass filter, where the input comprises the mixing of a radio frequency system under test pulsed waveform signal and a radio frequency local oscillator signal which have no correlation between them.
Figure 6B:
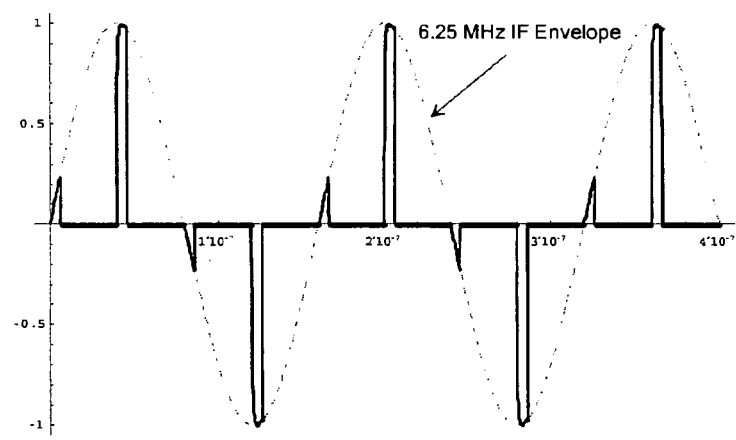
FIG. 6B depicts an exemplary embodiment of the respective input and output intermediate frequency waveform signals of a narrow-band bandpass filter, where the input comprises the mixing of a radio frequency system under test pulsed waveform signal and a radio frequency local oscillator signal which have partial correlation between them.
Figure 6C:
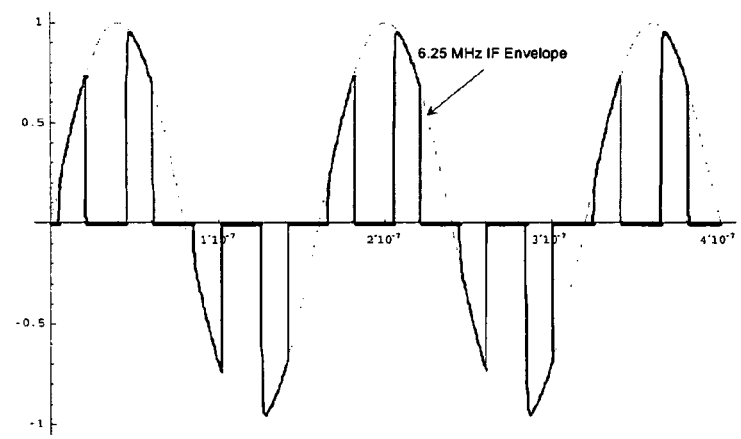
FIG. 6C depicts an exemplary embodiment of the respective input and output intermediate frequency waveform signals of a narrow-band bandpass filter, where the input comprises the mixing of a radio frequency system under test pulsed waveform signal and a radio frequency local oscillator signal which have full correlation between them.

FIGS. 6A, 6B and 6C respectively illustrate embodiments wherein the input IF waveform 32 transmitted to narrow-band bandpass filter (BPF) 31 are solid lines and the output IF waveforms 34 transmitted from narrow-band BPF 31 are dashed sinusoidal lines. In the FIG. 6A exemplary embodiment, there is no correlation between the RF SUT pulse 1 and an LO pulse 35, and the area inside the sinusoidal wave is at its lowest amount. In the FIG. 6C exemplary embodiment, there is full correlation between the RF SUT pulse 1 and an LO pulse 35, and the area inside the sinusoidal wave is at its greatest amount. In the FIG. 6B exemplary embodiment, there is partial correlation between the RF SUT pulse 1 and an LO pulse 35, and the area inside the sinusoidal wave is at a middle amount between the foregoing lowest and greatest amounts.

In the illustrated embodiment, the IF pulse train 32 signal is nominally a 6.25 MHz sine wave, as shown by the sinusoidal IF envelope, but is chopped in time. If the SUT pulse train 1 is uncorrelated with the LO pulse train 35, as illustrated in FIG. 6A, the duty cycle of the IF pulse train 32 is minimal, resulting in minimal energy in the IF pulse train 32. As the pulses 1, 35 align in time however (illustrated in the embodiments of FIGS. 6B, 6C, respectively), the duty cycle increases to a maximum of 40% in the embodiment of FIG. 6C, meaning the maximal duty cycle is limited by the lower duty cycle as between the pulse trains being correlated, which in the present embodiment is the duty cycle of the RF SUT pulse train 1. Here, the energy in the IF pulse train 32 is maximized.

In an embodiment, the IF pulse train 32 are be routed through a narrow-band BPF 31, as illustrated in FIG. 5, to yield the resulting IF pulse train 34. The bandwidth of the narrow-band BPF 31 can be set very narrow, so that it passes the 6.25 MHz fundamental of the IF pulse train 34, but rejects the second harmonic at 12.5 MHz, as well as other harmonics. Since the frequency spectrum of the pulsed waveform consists of a fundamental at 6.25 MHz, and spectral lines, spaced by the repetition frequency of 25 MHz, only a single spectral line (6.25 MHz fundamental) will pass through the filter 31. The output of the filter 31 is therefore a pure CW sine wave, with a magnitude proportional to the degree of timing correlation between the SUT RF output pulses 1 and the LO pulses 35.

In certain embodiments, the IF signal magnitude out of the narrow-band BPF 31 is digitized in a high resolution analog-to-digital (A/D) converter 24. In one such embodiment, the A/D converter samples at an exact 4× multiple of the IF (25 MHz in the present example), and the digital data 25 is processed, in accordance with known methods, to extract the magnitude and phase of the IF signal.

The filter bandwidths 23, 31 respectively, can be switchable 32, 34. In an embodiment, for measurements of SUT 3 phase and amplitude, the SUT RF output 1 and the LO output 35 are configured as CW signals, the wideband BPF 23 is selected, and phase and amplitude are measured as previously discussed. The wider bandwidth provides rapid settling time, and enables phase and amplitude measurements to be made very rapidly. For measurements of SUT 3 pulse timing, the SUT RF output 1 and the LO reference 35 can be configured as pulsed signals, the narrow-band BPF 31 can be selected, and the degree of correlation in the timing of the pulsed waveforms 1, 35 can be measured as the IF magnitude at the A/D converter. The narrow bandwidth converts the chopped waveforms, illustrated in the embodiment of FIG. 6, to a pure sine wave with magnitude proportional to the degree of correlation.

The timing characteristics of the RF SUT and LO pulse measurement waveforms are illustrated in FIGS. 7A, 7B and 8A, 8B. In these embodiments, FIGS. 7A, 8A respectively illustrate the envelopes of RF SUT pulse waveform signals 1, whereas FIGS. 7B, 8B respectively illustrate the envelopes of the LO pulse waveform signals 35. In the illustrated embodiments, each waveform is a repetitive pulse train, having 40 ns duration (meaning a 25 MHz repetition rate). The repetition rate can be selected to be the same as the A/D sample rate, so that it will not cause distortion in the measured data.

Figure 7A:
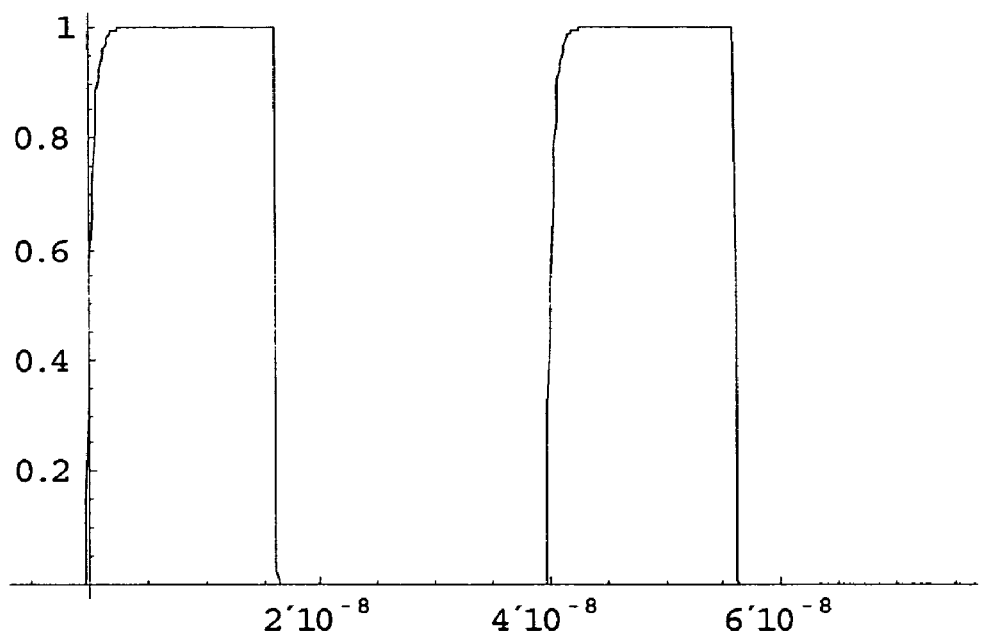
FIG. 7A depicts an exemplary embodiment of the envelope of a radio frequency system under test pulsed waveform, where the pulse rise time is insubstantial.
Figure 7B:
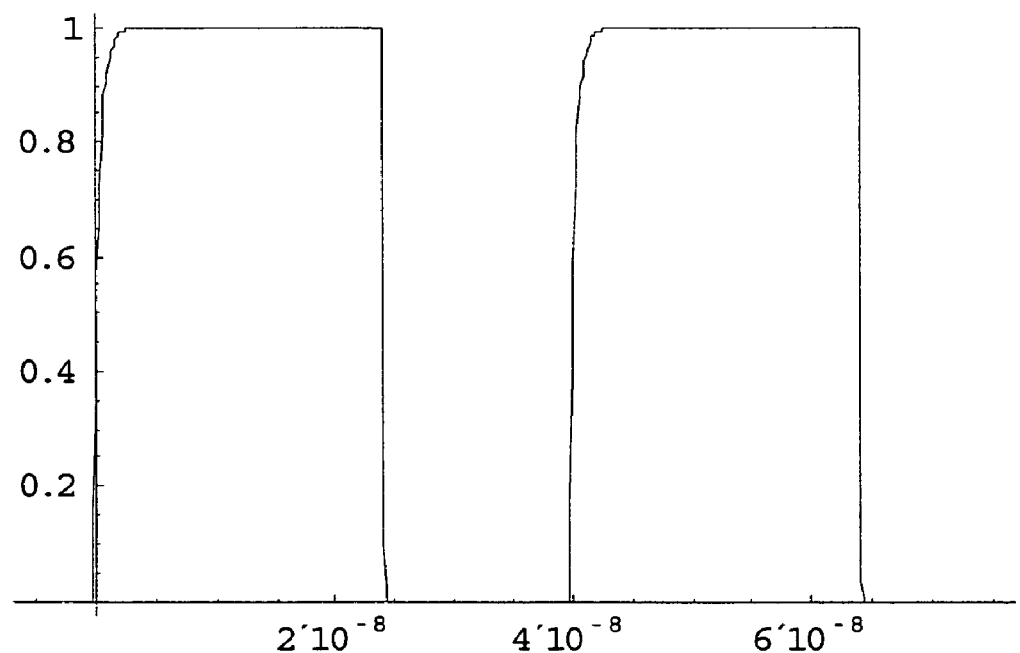
FIG. 7B depicts an exemplary embodiment of the envelope of a radio frequency local oscillator pulsed waveform, where the pulse rise time is insubstantial.
Figure 8A:
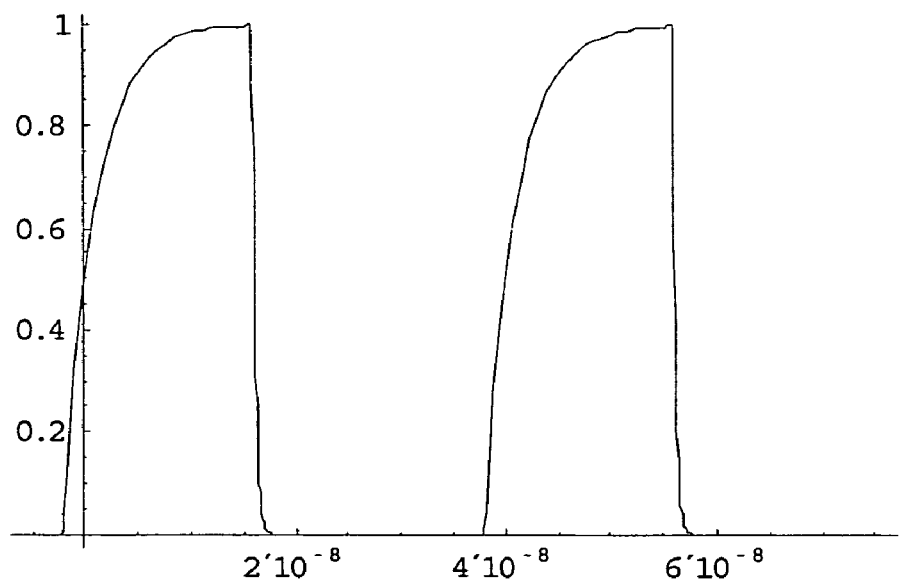
FIG. 8A depicts an exemplary embodiment of the envelope of a radio frequency system under test pulsed waveform, where the pulse rise time is substantial.
Figure 8B:
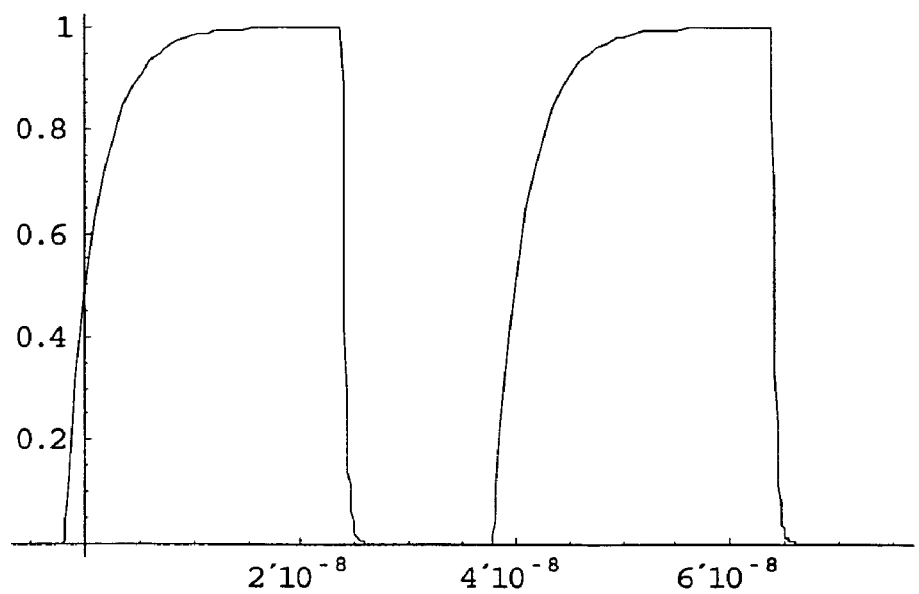
FIG. 8B depicts an exemplary embodiment of the envelope of a radio frequency local oscillator pulsed waveform, where the pulse rise time is substantial.

The embodiment of FIGS. 7A, 7B shows the nearly ideal case, in which the pulse rise time is so fast that it does not appreciably distort the idealized pulse, and the edges are essentially square. In such a case, the rise time can be insignificant. The embodiment of FIG. 8 shows a case that may be considered more typical of actual hardware in the real world. In this latter case, the pulse rise time is significant, and the exponential rise and decay causes a noticeable distortion to the pulse shape. This rise-time induced distortion of the pulse shape can have a corresponding effect on the correlation between the RF SUT and the LO reference signals, and must be accounted for when computing signal time of arrival.

Figure 9A:
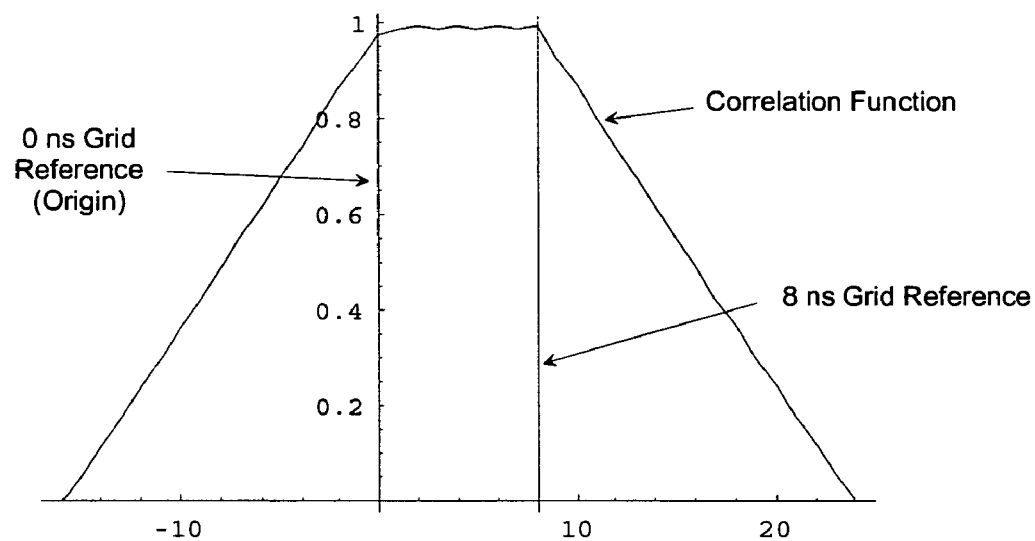
FIG. 9A depicts an exemplary embodiment of a correlation function produced from a radio frequency system under test pulsed waveform being swept in time through a reference radio frequency local oscillator pulsed waveform, where the pulse rise time is substantial.
Figure 9B:
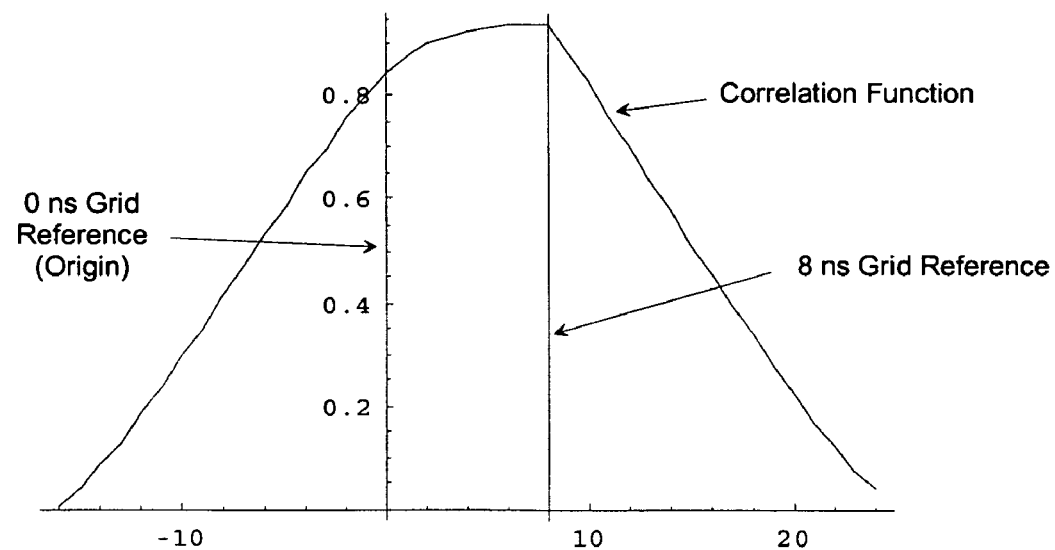
FIG. 9B depicts an exemplary embodiment of a correlation function produced from a radio frequency system under test pulsed waveform being swept in time through a reference radio frequency local oscillator pulsed waveform, where the pulse rise time is insubstantial.

The embodiments of FIGS. 9A and 9B respectively illustrate an exemplary correlation function that is produced as the RF SUT pulsed waveform 1 is swept in time through the LO reference pulsed waveform 35. This correlation function is the magnitude of the IF waveform at the output of the narrow-band BPF 31.

Referring to the embodiment of FIG. 9A, the embodiment illustrates the idealized function, produced if pulse rise time is insignificant. The function is zero when the RF SUT pulse 1 occurs 16 nanoseconds prior to the LO reference pulse 35, or at a −16 nanosecond delay on the domain axis, because, in this condition, the RF SUT pulse can occur during the dead time in the LO reference pulse train. As the amount of time by which the RF SUT pulse precedes the LO reference is reduced, for example by adding delay to the RF SUT pulse waveform, the magnitude of the filter 31 output can increase linearly until it reaches a maximum value at the point where the leading edges of the RF SUT and LO reference pulses are exactly aligned, or at a 0 nanosecond delay on the domain axis.

As the RF SUT pulse is further delayed with respect to the LO reference, or at a positive delay on the domain axis, the magnitude does not change until the delay reaches 8 nanoseconds. This occurs because the LO reference pulse is 8 nanoseconds wider than the RF SUT pulse, with the result that all values of delay between 0 and 8 nanoseconds produce the same result. At 8 nanoseconds, the trailing edges of the RF SUT and LO reference pulses are exactly aligned. As the RF SUT pulse is further delayed, the pulse trains begin to once again de-correlate in time, resulting in a linear decrease in amplitude, until the function reaches 0 at a 24 nanosecond delay. The latter is when the RF SUT pulse is once again occurring in the dead time of the LO reference waveform.

Two of the significant features of the correlation function shown in the embodiments of FIG. 9A and 9B are the corners respectively at 0 and 8 nanoseconds. These points correspond to the amount of applied delay that causes the RF SUT waveform 1 to exactly align with the LO reference waveform 35. The leading edge corner, at 0 nanoseconds relative delay, corresponds to the amount of delay that must be applied to the RF SUT waveform 1 to cause the leading edge of the RF SUT waveform 1 to exactly align with the leading edge of the LO reference waveform 35. The trailing edge corner, at 8 nanoseconds relative delay, corresponds to the amount delay that can be applied to the RF SUT to cause the trailing edge of the RF SUT to exactly align with the trailing edge of the LO reference.

With respect to the illustrated embodiments, when aligning actual hardware, the coordinates of these corners can deviate from their nominal values of 0 and 8 nanoseconds. However, in these embodiments, the coordinates of the corners are always the measurement of the amount of delay that must be added to align the waveforms. If the pulse width of the LO reference (PWLO) is a calibrated value, the pulse width of the RF SUT may be computed as follows:

$$PW\,SUT = PWLO + t_{Leading\,Edge} - t_{Trailing\,Edge} \quad \text{(Equation 1)}$$

where $t_{Leading\,Edge}$ refers to the timing coordinate of the leading edge, which is 0 ns in the illustrated embodiment, and $t_{Trailing\,Edge}$ refers to the timing coordinate of the trailing edge, which is 8 ns in the illustrated embodiment.

In one or more embodiments, the essence of the process to measure pulse timing characteristics is to sweep out the correlation function by measuring the amplitude at the output of the narrow-band BPF 31 as relative delay is incrementally changed, for example, between −16 and +24 ns, and then to locate the delay coordinates corresponding to the corners of the correlation function. This process can be complicated when rise-time becomes significant, as illustrated in the embodiment of FIG. 8, because the corners of the correlation function become indistinct, as illustrated in the embodiment of FIG. 9b.

Figure 10A:
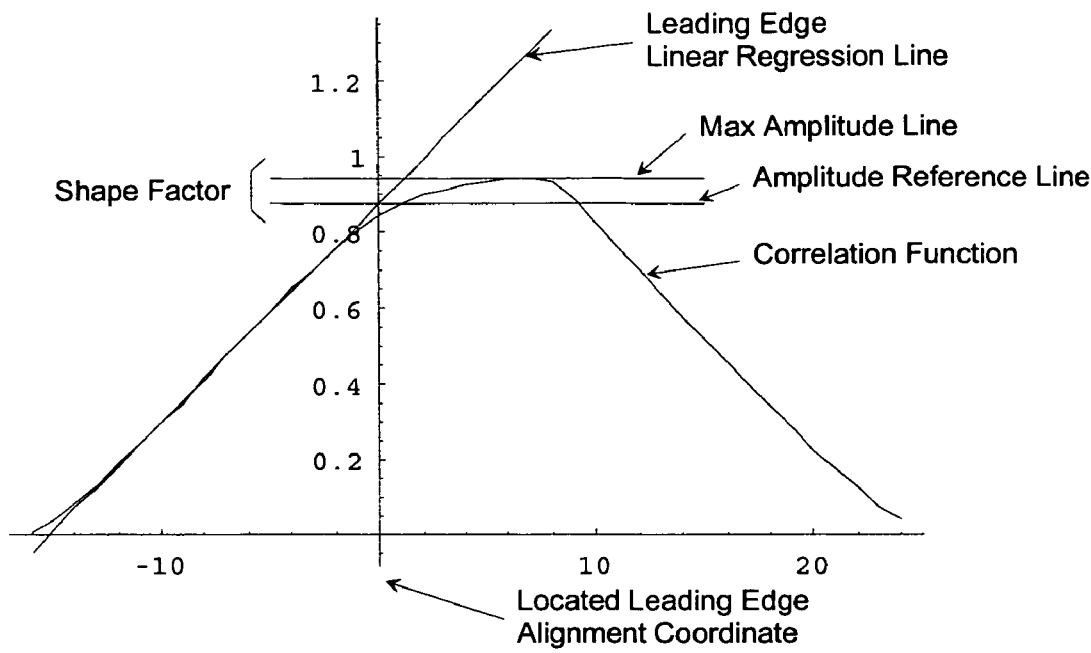
FIG. 10A shows how to compute leading edge time for a pulse with substantial rise-time distortion.
Figure 10B:
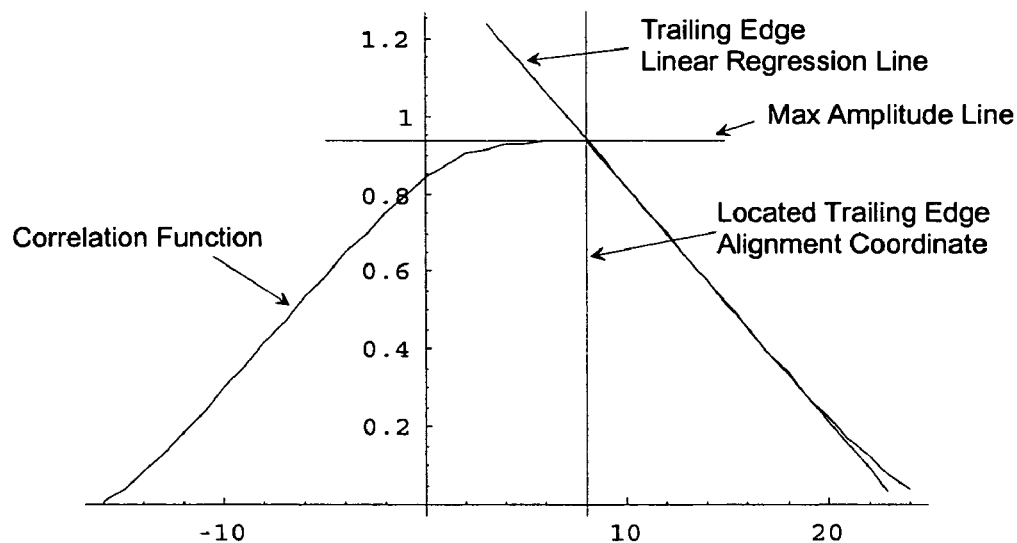
FIG. 10B shows how to compute trailing edge time for a pulse with substantial rise-time distortion.

The embodiment of FIG. 10A and FIG. 10B respectively illustrate an exemplary method for precisely locating the leading edge and trailing edge coordinates, despite the fact that the corners have been rounded off by non-negligible pulse rise time effects. Beginning with FIG. 10A, the figure illustrates the processing to extract the leading edge coordinate. In this embodiment, the coordinate is taken as the intersection of a leading edge linear regression line and a leading edge amplitude reference line.

In the embodiment, the leading edge linear regression line is computed by performing a linear fit to the leading edge of the correlation function, using for example values between 30% and 70% of full scale magnitude. (In the embodiment, this portion of the correlation function exhibits maximum linearity and is therefore the best reference for establishing a line). The amplitude reference line is found by multiplying the maximum amplitude by an empirically determined shape factor. In the embodiment of FIG. 10A, the shape factor is 0.934, which provides an appropriate location response for the rise-times illustrated in FIG. 8. If the actual hardware rise times were appreciably different, the shape factor may be adjusted slightly to trim the measurement response.

On the other hand, the embodiment of FIG. 10B illustrates the processing to extract the trailing edge coordinate. The coordinate is taken as the intersection of a trailing edge linear regression line and the trailing edge amplitude reference Line. In this embodiment, the processing is exactly the same as that for extracting the leading edge coordinate, except for the fact that the regression fit is performed on the trailing edge, and the shape factor is different. In this embodiment, the shape factor is unity because the fall time of the waveforms in FIG. 8 is quite fast, with the result that the correlation function has a distinct corner on the trailing edge.

Figure 11:
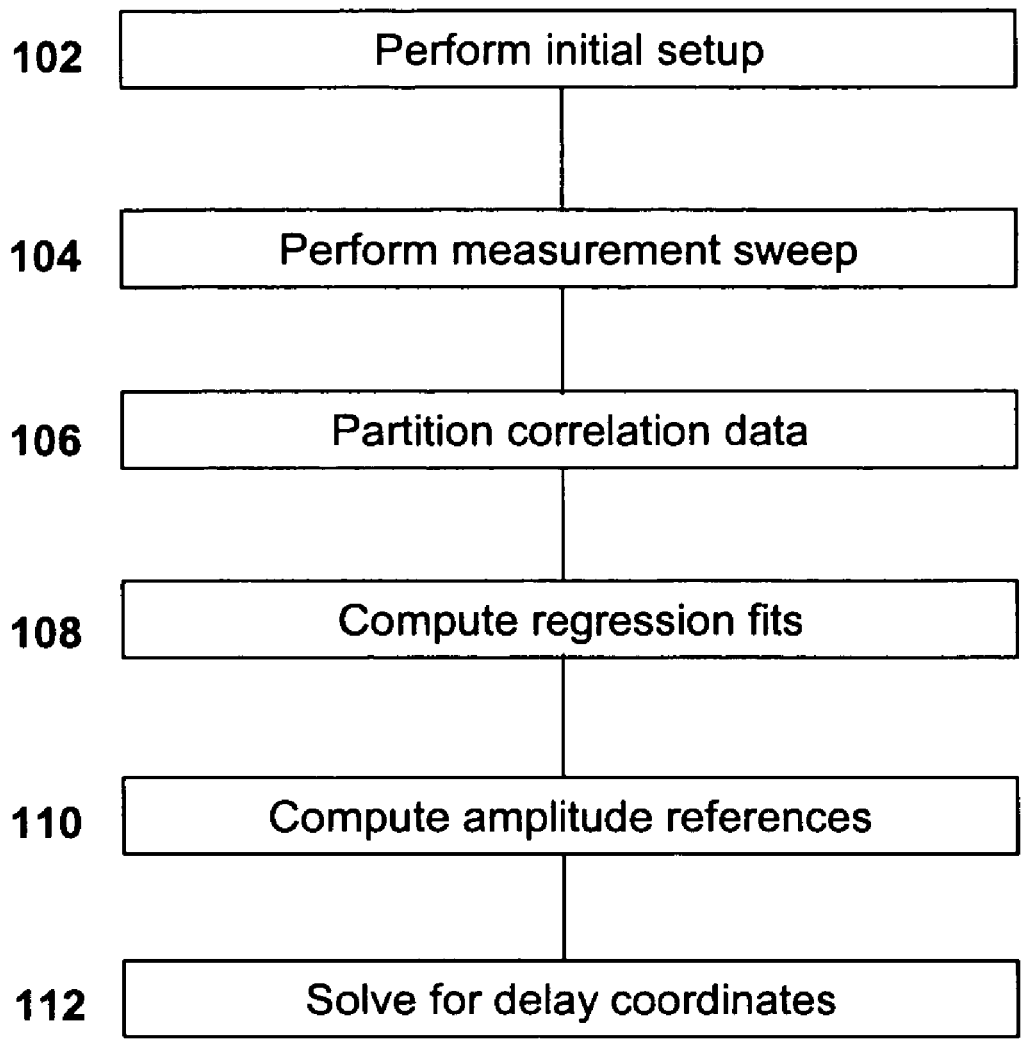
FIG. 11 depicts an exemplary flow chart for implementing the method described in reference to FIGS. 9A, 9B, 10A and 10B.

Referring to the flow chart of FIG. 11, an exemplary process for measuring pulse timing characteristics of the foregoing described embodiments can be summarized as follows:

In step 102, the initial setup is performed. The RF SUT to be aligned is selected and routed through the multiplexer 21, into the alignment receiver 33. The narrow-band BPF 31 is selected. The RF SUT 3 to output a 16 ns pulsed waveform is configured, in accordance with the embodiment described with reference to FIGS. 7A, 8A. The LO reference pulsed waveform 35 is configured to output a 24 ns pulsed waveform, in accordance with the embodiment described with reference to FIG. 7B, 8B.

In step 104, the measurement sweep is performed. The relative delay 11 for the RF SUT pulsed waveform 1 is set, for example, to −16 ns. After an appropriate settling time, the magnitude of the IF waveform signal at the A/D converter 24 is measured and stored. The delay is incremented in steps, for example of 0.1 ns, and the measurement for delay values between, for example −16 ns and +24 ns, is repeated, to produce 400 ordered pairs of amplitude versus delay in the present example.

In step 106, the correlation data is partitioned. The recorded correlation data is searched to find the peak amplitude. A leading edge data set is selected as any recorded value with delay less than the delay corresponding to the peak amplitude, whose measured amplitude is between, for example, 30% and 70% of the peak amplitude. A trailing edge data set is selected as any recorded value with delay greater than the delay corresponding to the peak amplitude, whose measured amplitude is between, for example, 30% and 70% of the peak amplitude.

In step 108, the regression fits are computed. A linear regression is computed to the leading edge and trailing edge data sets. The regressions will produce the equations for the leading edge linear regression line and the trailing edge linear regression line, respectively.

In step 110, the amplitude references are computed. The amplitude reference of the leading edge is computed by multiplying the maximum amplitude by the shape factor of the leading edge. Similarly, the trailing edge amplitude reference is computed by multiplying the maximum amplitude by the trailing edge shape factor.

In step 112, the delay coordinates are solved. If the regression fits are of the form: y=a+b Delay, the coordinates are extracted by setting y equal to the appropriate amplitude reference (denoted as Amp_Ref below), and solving for the delay coordinate, for example as follows:

$$\text{Delay} = (Amp\_Ref - a)/b$$

In this manner, two values for Delay are computed, one for the leading edge coordinate, and one for the trailing edge coordinate. The leading edge delay is the delay that must be applied to cause the RF SUT time of arrival to be precisely aligned with the LO reference pulse. The trailing edge coordinate can be used to compute pulse width, in accordance with Equation 1 denoted above.

Skilled persons will recognize a number of features and advantages offered by the described embodiments. For example, in the disclosed embodiments, a means is provided to accurately measure pulse time of arrival (PTOA) and pulse width (PW) to sub-nanosecond accuracy, for example, for RF or microwave pulses, over a very wide frequency range, for example from 50 MHz to 22 GHz.

One advantage of the disclosed embodiments is improvement in accuracy. In certain embodiments, pulse timing can be measured to well less than a nanosecond, and simulation can predict that RMS accuracy on the order of 100 picoseconds can be obtained. In these embodiments, the correlation processing averages noise sources to produce highly repeatable results.

Another advantage of the disclosed embodiments is frequency independence. The measurement receiver can be tunable across a wide range of microwave frequencies in certain embodiments, but can perform actual measurements at a fixed IF. This produces consistent results across frequency.

Another advantage of the disclosed embodiments is reduction of costs. In one or more embodiments, the approach eliminates the need for exotic high speed sampling oscilloscopes, which may be quite expensive.

Another advantage of the disclosed embodiments is compatibility. In one or more embodiments, where the present embodiments are utilized in electronic warfare (EW) systems, compatibility with next generation EW simulator alignment schemes may be achieved. For example, in certain embodiments, the technique disclosed herein is fully compatible with the previously discussed methodology for aligning phase and amplitude in modern EW simulation systems, requiring only minor modifications to the measurement receiver.

The embodiments illustrated and discussed in this specification are intended only to teach those skilled in the art the best way known to the inventors to make and use the invention. Nothing in this specification should be considered as limiting the scope of the present embodiments. All examples presented are representative and non-limiting. The above-described embodiments of the invention may be modified or varied, without departing from the invention, as appreciated by those skilled in the art in light of the above teachings. It is therefore to be understood that, without the scope of the claims and their equivalents, the invention may be practiced otherwise than as specifically described.

What is claimed is:

1. A device, comprising:
   first receiving unit disposed to receive from a first device one or more first pulsed signals;
   second receiving unit disposed to receive from a second device one or more second pulsed signals; and
   correlation device determining a correlation function from said first pulsed signals and said second pulsed signals, performing linear regression to determine timing characteristics of the correlation function, and aligning a timing characteristic of said first pulsed signals to an equivalent timing characteristic of said second pulsed signals based on the timing characteristics of the correlation function.

2. The device according to claim 1, wherein said first device comprises a plurality of pulsed radio frequency (RF) source under test (SUT) signal sources.

3. The device according to claim 2, wherein each said source under test (SUT) comprises:
   a pulse timing and control circuit disposed to receive any one of: a synchronization trigger signal; a delay signal; and a pulse width signal, and to transmit therefrom a gate signal;
   a pulse modulator circuit generating a said pulsed signal by gating, via said gate signal, a continuous wave radio frequency signal; and
   a wideband radio frequency synthesizer disposed to receive a frequency command signal and generate therefrom said continuous wave radio frequency signal.

4. The device according to claim 2, wherein said first receiving unit comprises a multiplexer disposed to select one of said first pulsed signals in a given time interval.

5. The device according to claim 4, wherein said first pulsed signals comprise radio frequency (RF) signals.

6. The device according to claim 5, wherein said first pulsed signals comprise microwave signals.

7. The device according to claim 1, wherein said second device comprises a local oscillator (LO) pulsed signal source.

8. The device according to claim 7, wherein said second pulsed signals comprise radio frequency signals.

9. The device according to claim 1, wherein said correlation device comprises a mixer disposed to multiply a first said pulsed signal with a second said pulsed signal to yield a third signal.

10. The device according to claim 9, wherein said third signal is an intermediate frequency (IF) continuous wave (CW) signal.

11. The device according to claim 9, wherein said correlation device comprises a bandpass filter disposed to pass a preselected frequency component of said third signal as a fourth signal.

12. The device according to claim 11, wherein the band pass filter comprises a narrow bandpass filter disposed to pass therethrough a fundamental harmonic frequency component of said third signal as said fourth signal and to remove from said third signal any higher ordered harmonic frequency components thereof.

13. The device according to claim 1, wherein said first pulsed signals and said second pulsed signals respectively comprise complimentary waveforms of differing duty cycles, said waveforms having a common repetition rate.

14. The device according to claim 13, wherein said correlation is performed in an analog-to-digital filter whose sample rate equals said common repetition rate.

15. An alignment receiver, comprising:
a correlation device according to claim 1; and
a third device comprising a wideband filter and an analog-to-digital filter, the combination thereof disposed to generate a representation of a said first pulsed signal, said representation comprising respective in-phase (I) and quadrature-phase (Q) components of a said first pulsed signal.

16. A method, comprising:
combining a first pulsed signal with a second pulsed signal;
correlating said first pulsed signal with said second pulsed signal to generate a correlation function, said correlation function having a leading edge and a trailing edge;
determining a delay coordinate for said leading edge and a delay coordinate for said trailing edge;
determining a delay between said first pulsed signal and said second pulsed signal based on said delay coordinate for said leading edge and said delay coordinate for said trailing edge 17. The method according to claim 16, wherein said first pulsed signal comprises a radio frequency (RF) pulsed signal generated by a source under test (SUT) device, and said second pulsed signal comprises a signal generated by a local oscillator (LO).

18. The method according to claim 17, wherein said combining step comprises mixing said first pulsed signal with said second pulsed signal to generate an intermediate frequency (If) continuous wave (CW) signal.

19. The method according to claim 18, wherein said mixing step comprises:
designating said source under test (SUT) device and said local oscillator (LO) to respectively generate said first pulsed signal and said second pulsed signal to be any one of: complimentary to one another; having differing duty cycles from one another; and having a common repetition rate to one another.

20. The method according to claim 19, wherein said correlating step comprises:
designating a first filter to filter out non-fundamental harmonic frequency components of said intermediate frequency (If) continuous wave (CW) signal.

21. The method according to claim 20, wherein said first filter passes therethrough a fundamental harmonic frequency component of said intermediate frequency (IF) continuous wave (CW) signal, and removes from said intermediate frequency (IF) continuous wave (CW) signal any higher ordered harmonic frequency components thereof.

22. The method according to claim 21, wherein the resulting signal from said first filter comprises a continuous sinusoidal waveform signal.

23. The method according to claim 22, wherein the magnitude of said continuous sinusoidal waveform signal is measured as a function of relative delay to determine said correlation function.

24. The method of claim 20, wherein said correlating step comprises:
designating a second filter to determine the respective amplitudes corresponding to respective delays between said first pulsed signal and said second pulsed signal.

25. The method according to claim 19, wherein said correlating step comprises:
designating a first filter to pass therethrough a fundamental harmonic frequency component of a mixed signal resulting from mixing of said first pulsed signal and said second pulsed signal, and removing from said mixed signal any higher ordered harmonic frequency components thereof; and
designating a second filter to determine the respective amplitudes corresponding to respective delays between a product of said first pulsed signal and said second pulsed signal, said product comprising said correlation function.

26. The method according to claim 25, wherein said first filter comprises a narrow-band bandpass filter, and wherein said second filter further comprises an analog-to-digital filter.

27. The method according to claim 16, wherein the determining a delay coordinate comprises:
determine said delay coordinate for said leading edge from an amplitude reference for said leading edge of said correlation function and determining said delay coordinate for said trailing edge from an amplitude reference for said trailing edge of said correlation function.

28. The method according to claim 27, wherein said amplitude reference for said leading edge is determined from a maximum amplitude of said leading edge and a shape factor for said leading edge.

29. The method according to claim 28, wherein the determining of said amplitude reference comprises:
determining said maximum amplitude of said leading edge;
determining a linear regression fit for said leading edge;
determining said shape factor empirically from said linear regression fit; and
multiplying said maximum amplitude of said leading edge with said shape factor for said leading edge to determine said amplitude reference for said leading edge.

30. The method according to claim 27, wherein said amplitude reference for said trailing edge is determined from a maximum amplitude of said trailing edge and a shape factor for said trailing edge.

31. The method according to claim 30, wherein the determining of said amplitude reference comprises:
determining said maximum amplitude of said trailing edge;
determining a linear regression fit for said trailing edge;
determining said shape factor empirically from said linear regression fit; and
multiplying said maximum amplitude of said trailing edge with said shape factor for said trailing edge to determine said amplitude reference for said trailing edge.

* * * * *